US006833994B2

(12) United States Patent
Yair et al.

(10) Patent No.: US 6,833,994 B2
(45) Date of Patent: Dec. 21, 2004

(54) ELECTRONICS ASSEMBLY

(75) Inventors: Andrew John Yair, Swindon (GB); John David Schnabel, Fareham (GB); Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 156 days.

(21) Appl. No.: 10/166,519

(22) Filed: Jun. 10, 2002

(65) Prior Publication Data

US 2003/0227752 A1 Dec. 11, 2003

(51) Int. Cl.$^7$ .................................................. G06F 1/16
(52) U.S. Cl. ...................................... 361/725; 206/588
(58) Field of Search .............................. 361/724–727, 361/638–686; 312/223.1–223.3, 9.63; 206/588–592

(56) References Cited

U.S. PATENT DOCUMENTS

| | | | |
|---|---|---|---|
| 2,957,668 A | | 10/1960 | Norquist et al. |
| 4,083,616 A | | 4/1978 | McNiece et al. |
| 4,751,872 A | | 6/1988 | Lawson, Jr. |
| 4,914,552 A | | 4/1990 | Keemer |
| 4,974,377 A | | 12/1990 | Dominitz et al. |
| 5,100,096 A | | 3/1992 | Mizuno et al. |
| 5,124,886 A | | 6/1992 | Golobay |
| 5,145,243 A | | 9/1992 | Liu |
| 5,189,277 A | | 2/1993 | Boisvert et al. |
| 5,214,572 A | | 5/1993 | Cosimano et al. |
| 5,216,578 A | | 6/1993 | Zenitani et al. |
| 5,264,986 A | * | 11/1993 | Ohgami et al. ............. 361/685 |
| 5,333,830 A | | 8/1994 | Millen |
| 5,373,133 A | | 12/1994 | Brockway et al. |
| 5,394,305 A | | 2/1995 | Moral et al. |
| 5,460,441 A | | 10/1995 | Hastings et al. |
| 5,562,410 A | | 10/1996 | Sachs et al. |
| 5,593,219 A | | 1/1997 | Ho |
| 5,644,991 A | | 7/1997 | Prevot et al. |
| 5,663,868 A | | 9/1997 | Stalley |
| 5,734,558 A | | 3/1998 | Poplawski et al. |
| 5,734,561 A | | 3/1998 | Wolf et al. |
| 5,741,985 A | | 4/1998 | Gaete |
| 5,758,855 A | | 6/1998 | Jordan et al. |
| 5,777,845 A | * | 7/1998 | Krum et al. ................. 361/685 |
| 5,788,467 A | | 8/1998 | Zenitani et al. |
| 5,808,876 A | | 9/1998 | Mullenbach et al. |
| 5,838,551 A | | 11/1998 | Chan |

(List continued on next page.)

FOREIGN PATENT DOCUMENTS

| | | |
|---|---|---|
| EP | 1198867 | 3/2004 |
| GB | 2211360 | 6/1989 |
| JP | 05-021973 | 1/1993 |
| JP | 2000-151137 | 5/2000 |
| JP | 2002-145267 | 5/2002 |
| JP | 2002-145269 | 5/2002 |
| WO | 99/60834 | 11/1999 |

*Primary Examiner*—Lisa Lea-Edmonds
(74) *Attorney, Agent, or Firm*—Meyertons Hood Kivlin Kowert & Goetzel, P.C.; B. Noël Kivlin

(57) ABSTRACT

An electronics assembly comprises:
(i) a chassis (1);
(ii) at least one front panel (40, 42) that is arranged in front of the chassis to obscure the chassis; and
(iii) at least one device (60) that is mounted on the chassis and supports the or a front panel.

The or each device (60) or the or each panel (40, 42) includes at least one retaining element (62) that extends out of the device or panel and is received in a recess in the or each panel or in the or each device respectively to retain the panel on the chassis. The element is manually retractable into the device or panel to allow the panel to be removed from the chassis. The assembly may include, for example, air filters in the panel(s), and these may be changed quickly so that the assembly does not need to be powered down.

15 Claims, 3 Drawing Sheets

U.S. PATENT DOCUMENTS

| | | | |
|---|---|---|---|
| 5,864,088 A | 1/1999 | Sato et al. | |
| 5,877,938 A | 3/1999 | Hobbs et al. | |
| 5,884,988 A | 3/1999 | Foo et al. | |
| 5,886,639 A | 3/1999 | Behl et al. | |
| 5,914,864 A | 6/1999 | MacDonald, Jr. et al. | |
| 5,944,199 A | 8/1999 | Corisis et al. | |
| 5,973,926 A | 10/1999 | Sacherman et al. | |
| 5,975,659 A | 11/1999 | Yang et al. | |
| 5,980,295 A | 11/1999 | Lai et al. | |
| 5,996,960 A | 12/1999 | Krajec | |
| 6,031,719 A | 2/2000 | Schmitt et al. | |
| 6,031,733 A | 2/2000 | Corisis et al. | |
| 6,040,981 A | 3/2000 | Schmitt et al. | |
| 6,061,237 A | 5/2000 | Sands et al. | |
| 6,075,694 A | 6/2000 | Mills et al. | |
| 6,075,698 A | 6/2000 | Hogan et al. | |
| 6,088,222 A | 7/2000 | Schmitt et al. | |
| 6,115,237 A | 9/2000 | Zahorsky et al. | |
| 6,115,250 A | 9/2000 | Schmitt | |
| 6,129,327 A | 10/2000 | Dubois | |
| 6,138,347 A | 10/2000 | Persson et al. | |
| 6,141,211 A | 10/2000 | Strickler et al. | |
| 6,147,862 A * | 11/2000 | Ho | 361/685 |
| 6,147,873 A | 11/2000 | Huang | |
| 6,166,900 A | 12/2000 | Flynn et al. | |
| 6,185,097 B1 | 2/2001 | Behl | |
| 6,191,928 B1 | 2/2001 | Rector et al. | |
| 6,213,819 B1 | 4/2001 | Fan | |
| 6,215,659 B1 | 4/2001 | Chen | |
| 6,219,229 B1 | 4/2001 | Lee | |
| 6,227,515 B1 | 5/2001 | Broyles | |
| 6,236,564 B1 | 5/2001 | Fan | |
| 6,244,953 B1 | 6/2001 | Dugan et al. | |
| 6,247,898 B1 | 6/2001 | Henderson et al. | |
| 6,252,770 B1 | 6/2001 | Yu et al. | |
| 6,256,205 B1 | 7/2001 | Perry et al. | |
| 6,267,606 B1 | 7/2001 | Poplawski et al. | |
| 6,285,547 B1 | 9/2001 | Vigeant et al. | |
| 6,297,950 B1 * | 10/2001 | Erwin | 361/685 |
| 6,322,042 B1 | 11/2001 | Nemec | |
| 6,324,075 B1 | 11/2001 | Unrein et al. | |
| 6,325,636 B1 | 12/2001 | Hipp et al. | |
| 6,330,156 B1 | 12/2001 | Cresse | |
| 6,373,695 B1 * | 4/2002 | Cheng | 361/685 |
| 6,373,698 B1 | 4/2002 | Christensen | |
| 6,388,875 B1 | 5/2002 | Chen | |
| 6,395,976 B1 | 5/2002 | Koradia et al. | |
| 6,411,506 B1 | 6/2002 | Hipp et al. | |
| 6,411,526 B1 | 6/2002 | Nguyen et al. | |
| 6,414,845 B2 | 7/2002 | Bonet | |
| 6,442,020 B1 | 8/2002 | Liu et al. | |
| 6,473,297 B1 | 10/2002 | Behl et al. | |
| 6,480,391 B1 | 11/2002 | Monson et al. | |
| 6,510,055 B1 | 1/2003 | Liu et al. | |
| 6,515,854 B1 * | 2/2003 | Claprood | 361/685 |
| 6,522,539 B2 | 2/2003 | Ota et al. | |
| 6,526,333 B1 | 2/2003 | Henderson et al. | |
| 6,549,406 B1 | 4/2003 | Olesiewicz et al. | |
| 6,556,437 B1 | 4/2003 | Hardin | |
| 6,563,706 B1 | 5/2003 | Strickler | |
| 6,590,768 B1 | 7/2003 | Wiley | |
| 6,594,148 B1 | 7/2003 | Nguyen et al. | |
| 6,621,708 B1 | 9/2003 | Sparkes et al. | |
| 6,621,709 B1 | 9/2003 | Schnabel et al. | |
| 6,621,711 B1 | 9/2003 | Haworth et al. | |
| 6,678,157 B1 | 1/2004 | Bestwick | |
| 6,680,850 B2 | 1/2004 | Osborn et al. | |
| 6,683,794 B2 | 1/2004 | Schnabel et al. | |
| 6,700,351 B2 | 3/2004 | Blair et al. | |
| 2002/0044421 A1 | 4/2002 | Cheng | |
| 2002/0048520 A1 | 4/2002 | Lu et al. | |
| 2002/0060900 A1 | 5/2002 | Qiu et al. | |
| 2002/0112653 A1 | 8/2002 | Moore, Jr. et al. | |
| 2002/0126461 A1 | 9/2002 | Yazaki | |
| 2002/0167797 A1 | 11/2002 | Willars et al. | |
| 2002/0173265 A1 | 11/2002 | Kipka et al. | |
| 2003/0063454 A1 | 4/2003 | Wilson et al. | |
| 2003/0226675 A1 | 12/2003 | Osborn et al. | |
| 2003/0226949 A1 | 12/2003 | Cain et al. | |
| 2003/0227755 A1 | 12/2003 | Haworth | |
| 2003/0227757 A1 | 12/2003 | Vincent et al. | |
| 2004/0032722 A1 | 2/2004 | Wrycraft et al. | |

* cited by examiner

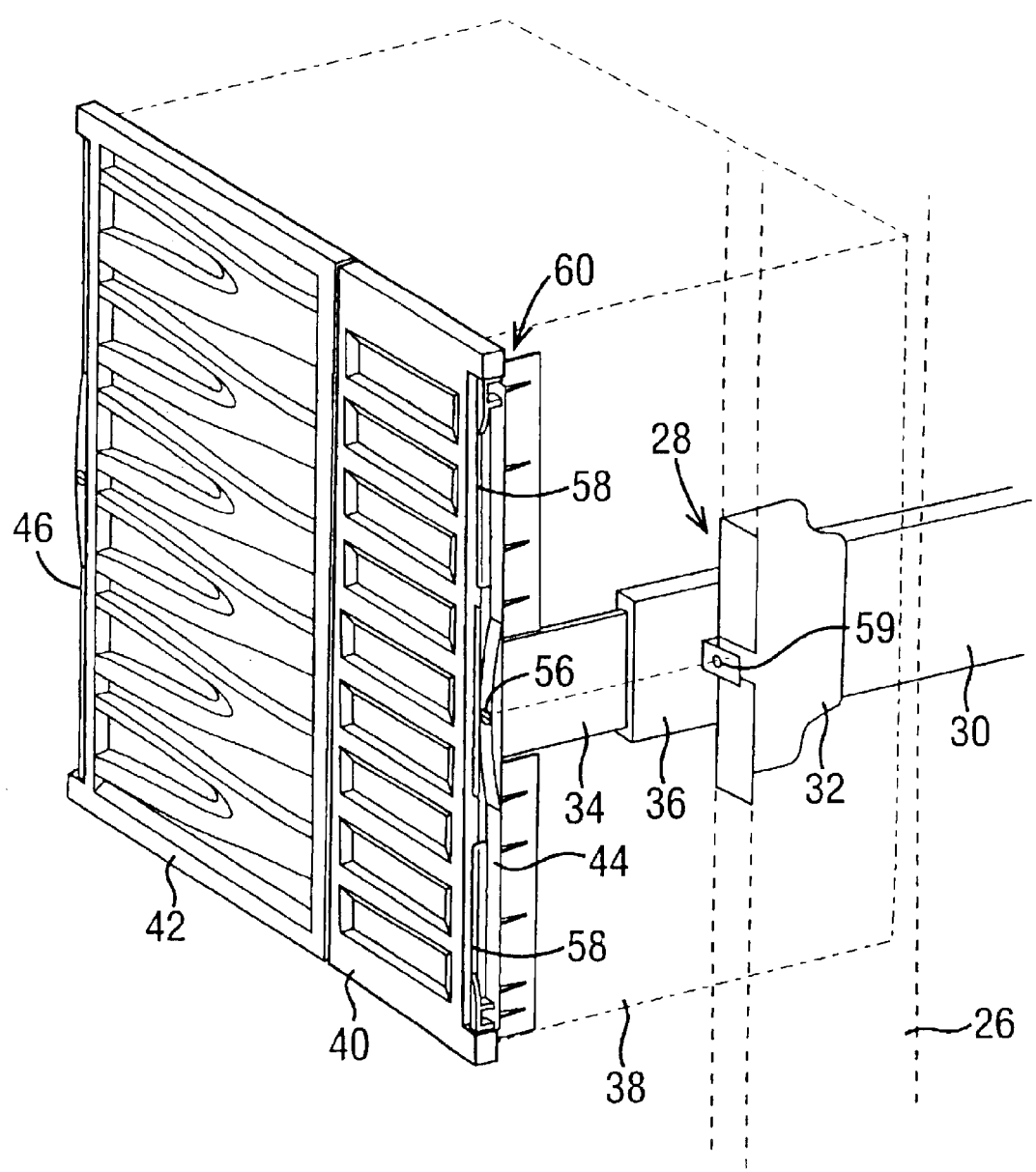

ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it. An assembly will typically have dimensions in the order of 0.5 m in each direction and will be located in an enclosure, for example a cabinet, in an office, data centre, computer room or similar environment. Often, more than one such assembly is located in the same enclosure, and will need to be accessed from time to time for routine maintenance, repair or upgrading.

Because of the amount of heat that is generated during operation of the equipment and the thermal sensitivity of the equipment, it is necessary to provide cooling fans in order to direct a current of air through the assembly or otherwise permanent damage would occur. Typically air blown through the assembly needs to be filtered to remove dust and other contaminants. Replacement of the filters generally leads to downtime of the system, the length of which should be minimised.

SUMMARY OF THE INVENTION

According to one aspect, the present invention provides an electronics assembly which comprises:
(i) a chassis;
(ii) at least one front panel that is arranged in front of the chassis to obscure the chassis; and
(iii) at least one device that is mounted on the chassis and supports the or a front panel,
wherein the or each device or the or each panel includes at least one retaining element that extends out of the device or panel and is received in a recess in the or each panel or in the or each device respectively to retain the panel on the chassis, the element being manually retractable into the device or panel to allow the panel to be removed from the chassis.

Such an assembly has the advantage that the panel can be removed and replaced within a very short period of time, often no more than a matter of seconds, thereby minimising the danger of contamination of the system.

The panel or panels may be located on the front surface of the chassis where this surface has the array of air filters. In such an assembly, the motherboard may be located horizontally at the bottom of the assembly and the daughterboards are arranged vertically above the motherboard. In order to cool the electronics components, an array of fans may be arranged in the front wall of the chassis to blow air through the chassis from the front to the rear.

The retaining elements may be located either on the device(s) or on the panel(s), but usually they will be located on the devices. In order to enable the service engineer to manipulate the retaining element as easily as possible, for example simply by using a finger, the retaining element may be biassed out of the device or panel by means of a spring, and also may be provided with a tab or other projection that extends from the side thereof to enable it to be retracted. The service engineer can then simply hold a panel with one hand and flick the retaining element with a finger of the other hand to release the panel from the chassis. Retaining elements will normally be provided at the top and bottom of each panel. It is not necessary for all the retaining elements to be retractable since it is possible, for example, for the upper retaining elements to be retracted to release the top part of the panel, and the panel then simply be lifted off the chassis. Alternatively, retaining elements may be retracted at the top and the bottom of the panel and the panel then be pulled away from the chassis.

A single panel only may be present if desired. However, it is often more convenient for more than one panel to be employed so that any panel obscures only part of the front of the chassis. For example, a pair of supporting devices may be provided, one on either side of the chassis, and each device supporting one of a pair of panels. This arrangement is particularly convenient when the electronics assembly is supported in an enclosure, for example a cabinet, by means of a telescopic slider mechanism. Such mechanisms usually comprise a pair of telescopic sliders, one arranged on either side of the chassis, each having a fixed part that is fixed with respect to the enclosure, and a movable part that is attached to the chassis, and the telescopic slider is extendable to allow the chassis to be pulled out of the enclosure and retractable to allow the chassis to be pushed back into the enclosure. In such a form of enclosure, the or at least one device may have an arrangement for enabling it to be secured to the fixed part of the slider mechanism or to any other part of the enclosure in order to prevent removal of the chassis from the enclosure. The telescopic sliders will normally be arranged on posts within the enclosure and will extend on either side of the chassis horizontally from the front to the rear thereof. The device, on the other hand, will normally extend vertically over the height of the chassis at the edge between the front of the chassis and the side, in order to provide support at both the top and the bottom of each panel. When the chassis is pushed into the enclosure, the front end of the fixed part of each telescopic slide will then be adjacent to the edge between the front and side faces of the chassis, and the fixed part of the telescopic slide may conveniently be secured to the device. Where more than one device is employed, each device may be attached to the front end of the telescopic slide. In certain circumstances, it may be appropriate for the securing arrangement to require the use of a tool in order to release the device from the slider mechanism or the enclosure in order to prevent accidental or unauthorised access to the electronics assembly. Such arrangement may, for instance, be in the form of a lock that requires key access, or in an alternative arrangement, it may simply require a screwdriver to release the chassis.

Where the chassis is designed to be pulled out of the enclosure, for example on telescopic slides, a handle may be provided on the or each device to enable the chassis to be grasped easily. Such a handle may simply be a lip having an arcuate transverse cross-section along at least part of its length.

The electronics assembly will need to be pulled out of the enclosure for access to the interior thereof for maintenance, repair or upgrading. However, if access to the assembly is required merely to change the air filters in the front panel, which may well occur at more frequent intervals, it may not be appropriate to require the assembly to be removed from the enclosure, and so the assembly may be designed to allow removal of the panel(s) when it is still located within the enclosure.

The panels may be designed simply to be fixed to the front surface of the chassis and lifted off the chassis sip when necessary, for example to change air filters. However, the assembly may be provided with other equipment that requires access. For example, in one form of assembly, a panel having displayed information may be present, or equipment such as disc drives, tape drives and the like may be located on the front surface of the chassis. Such equipment may still need a through flow of air for cooling, and hence will need air filtering, but without the need to remove the panel for access. In such a case, the retaining elements may be in the form of pins or other retaining devices having a circular cross-section that are received in circular holes in order to enable the panel to be swung open in the manner of a door.

According to another aspect, the present invention provides a chassis for an electronics assembly which includes at least one device that is mounted on the chassis for supporting a panel in front of the chassis to obscure it, wherein the or each device includes at least one retaining element that extends out of the device and can be received in a recess in the or each panel for retaining the panel on the chassis, the element being manually retractable into the device to allow the panel to be supported by, or removed from, the chassis.

The device for supporting the panel is novel per se and so, according to another aspect, the invention provides a device for supporting a panel on the chassis of an electronics assembly, the device comprising an elongate body that is mountable on the chassis and has, at each end thereof, a retaining element that extends out of the device to be received in a corresponding recess of a panel and which is manually retractable into the device in order to release the panel.

There will usually be relatively little room between the chassis and the walls of the enclosure, so that the body of the device will be relatively narrow having a width in the region of about 2 to about 3 cm. It may, for example, be in the form of an elongate moulding having a generally flat portion that is securable to a side surface of the chassis at the front thereof, and a flange extending along substantially the length thereof that will lie in a plane parallel to the plane of the front surface of the chassis and extend between the chassis and the side wall of the enclosure to obscure the end of the telescopic slider mechanism. With such a form, when the chassis is pushed back into the enclosure, a part of the flange will abut the front end of the slider mechanism, and this part of the flange may be provided with an arrangement for securing it to the slider mechanism.

BRIEF DESCRIPTION OF THE DRAWINGS

Embodiments of the present invention will now be described in detail by way of example with reference to the accompanying drawings, in which corresponding parts are given like reference numbers. In the drawings:

FIG. 2 is a perspective view of an assembly according to the present invention incorporating the assembly shown in FIG. 1;

DESCRIPTION OF PARTICULAR EMBODIMENTS

Figure 1:
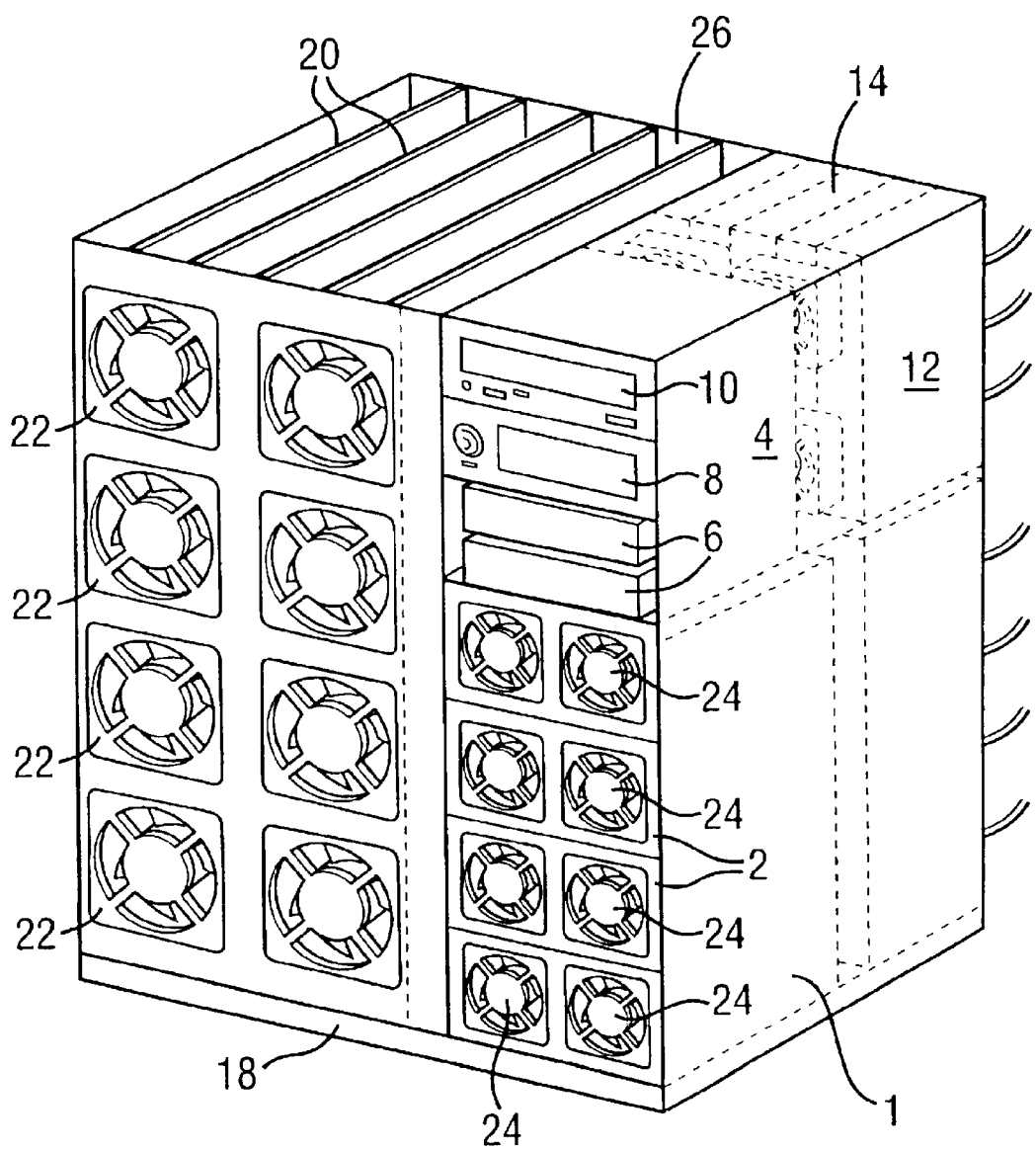
FIG. 1 is a schematic perspective view of an electronics assembly mounted in a chassis.

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed as a nineteen inch rack to be located in an electronics cabinet although other sizes may be employed, for example twenty-three inch or metric sized racks. The assembly may be designed to be a so-called "RAS" system, that is to say, to have high reliability, availability and serviceability. As such, it is intended that the system will operated with the minimum amount of down time, and so a degree of redundancy may be incorporated so that the system will continue to operate even when certain components have failed. In addition, servicing of the equipment should take as short a time as possible, and, where practical, components can be replaced without switching the system off.

The assembly comprises a chassis 1 in which the various components are located. The chassis contains a number of power modules 2 for converting mains a.c. power to an appropriate d.c. voltage, a media area 4 that contains hard disc drives 6, a tape drive 8 and a CD-ROM or digital video disc (digital versatile disc (DVD)) drive 10, and a part 12 that contains a number of I/O cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc.

Eight fans 22 are provided in an array at the front of the chassis in order to blow air through the assembly between the daughterboards 20 for cooling the motherboard and the daughterboards. Additional fans are provided such as fans 24 in the power modules 2, and further fans located between the media area 4 and the I/O cards 14.

In use, the assembly is housed in an enclosure in the form of a cabinet. The cabinet will be provided with a number of posts 26 which provide rigidity to the enclosure and support the assembly, as shown in FIG. 2. The assembly is supported on the posts by means of a telescopic slider mechanism comprising a pair of telescopic sliders 28, one such slider being located on either side of the assembly. The telescopic slider comprises a fixed part 30 that is attached to the posts by means of brackets 32, the spacing of the brackets 32 being adjustable in order to accommodate different sizes of cabinet. In addition to the fixed part 30, each slider has two movable parts, one movable part 34 being attached to a side wall 38 of the chassis, and the other, an intermediate part 36, being supported by the fixed part 30 and itself supporting the movable part 34. This slider mechanism enables the assembly to be pulled forward until it is entirely outside the enclosure, and the various parts of the assembly can be accessed for maintenance purposes.

In order to ensure that there is no contamination of the air that is blown through the assembly, air filters are provided that are located inside two front panels 40 and 42 that are attached to the front surface of the chassis.

Figure 3:
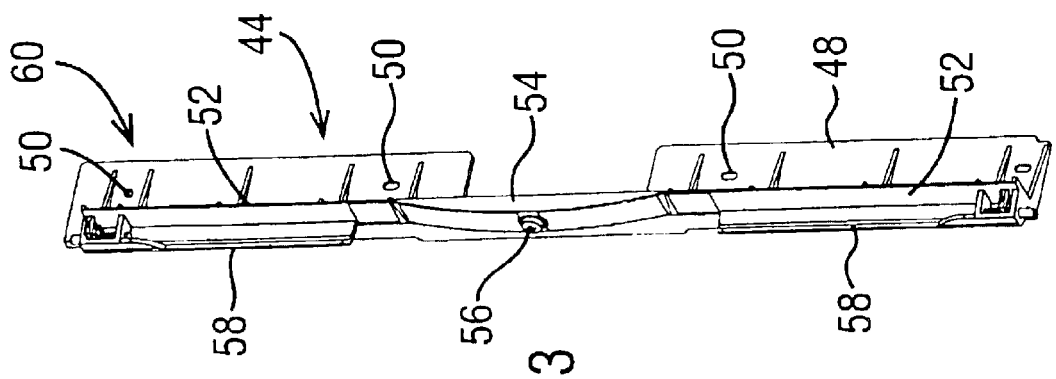
FIG. 3 is a perspective view of a device for mounting the front panels of the assembly shown in FIG. 3.

A device 44 and 46 in the form of an elongate edge moulding is provided at the vertical edge where the front surface and the side wall 38 of the chassis 1 meet, and a corresponding further device is provided on the other side of the chassis, the two devices having a mirror symmetry to one another. One such device is shown in FIG. 3. Each device has a relatively flat side 48 that has a number of screw holes 50 therein for fixing it to the side wall 38 of the chassis. The device also has a front wall 52 which, when the device is located on the chassis, will extend away from the chassis in a plane that is substantially parallel to the plane of the front surface of the chassis, so that the device has a generally "L"-shaped transverse cross-section.

The device has a central part 54 on its front wall which can be secured to the front bracket 32 of the fixed part of the telescopic slider 28 by means of a captive screw 56 that can be screwed into a hole 58 in the front surface of the bracket. This ensures that the assembly will remain secured within the enclosure and cannot accidentally be pulled out.

Handles 58 are provided above and below the central part 54 of the device in order to enable the assembly to be pulled out of the enclosure on the telescopic sliders once the screws 56 have been unscrewed.

Figure 4:
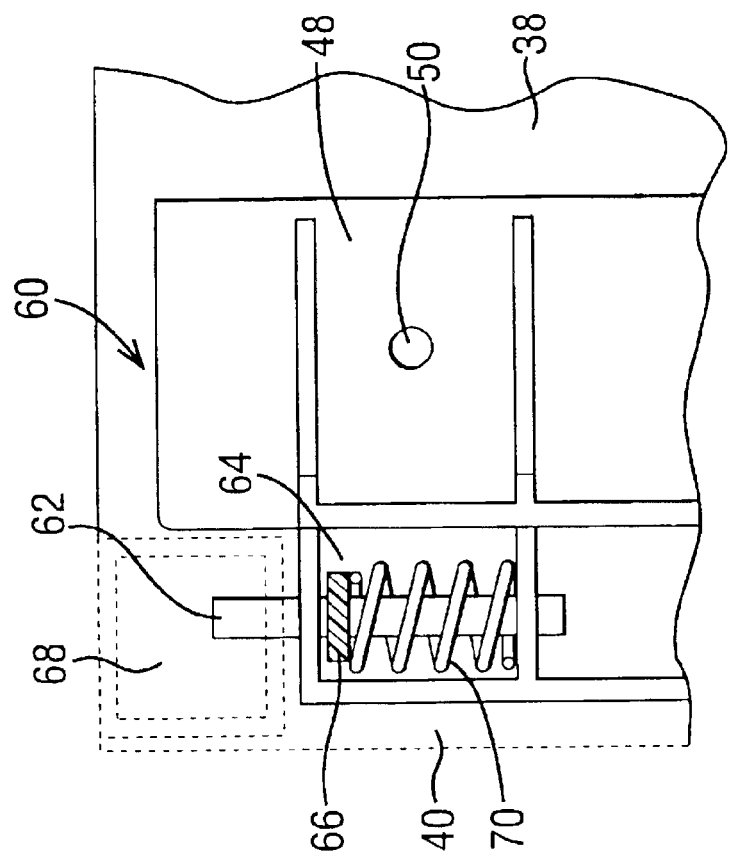
FIG. 4 is a side elevation of part of the device shown in FIG. 3 in greater detail.

In order to retain the doors 40 and 42 on the front of the assembly, each device has, at the upper and lower end thereof, a retaining arrangement 60 shown in more detail in FIG. 4. This arrangement comprises a pin 62 that extends in line with the device and is held within a recess 64 at the upper and lower end of the device and has a finger operable tab 66 that extends transversely of the pin out of the recess 64. The pin 62 is biassed to extend out of the end of the recess 64 and into a corresponding recess 68 in the door 40 by means of a helical spring 70. The recess 64 is open to the side of the assembly along its length to allow movement of the pin 62 by means of the tab 66.

In order to remove the doors 40 and 42, the service engineer simply grasps the upper or lower corner of the door and pull the tab 66 with a finger against the bias of the spring 70 until the pin has retracted and the door, or at least that part of the door, can be released. Following a corresponding operation on the other end of the door, it may be removed, and have its filter replaced. It can then be reattached by the same operation.

The device thus holds the doors enabling quick release and replacement thereof, enables the electronics assembly to be secured within the enclosure, and allows withdrawal of the assembly from the enclosure and reinsertion therein.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises:
   (i) a chassis;
   (ii) at least one front panel that is arranged in front of the chassis to obscure the chassis; and
   (iii) at least one device that is mounted on the chassis and supports the or a front panel, wherein the or each device or the or each panel includes at least one retaining element that extends out of the device or panel and is received in a recess in the or each panel or in the or each device respectively to retain the panel on the chassis, the element being manually retractable into the device or panel to allow the panel to be removed from the chassis.

2. An assembly as claimed in claim 1, wherein the or each device includes the retaining element or elements.

3. An assembly as claimed in claim 1, wherein the or each retaining element is biassed to extend out of the device or panel by means of a spring.

4. An assembly as claimed in claim 1, wherein the or each retaining element has a projection that extends from the side thereof to enable it to be retracted.

5. An assembly as claimed in claim 1, wherein two retaining elements are provided for retaining the or each panel on the chassis.

6. An assembly as claimed in claim 1, wherein a device is mounted on each of two opposing sides of a face of the chassis.

7. An assembly as claimed in claim 6, which includes two panels, each of which is supported by one of the devices.

8. An assembly as claimed in claim 1, wherein the or each retaining element is in the form of a pin, and allows the or each panel to be swung open.

9. An electronics assembly which comprises:
   a chassis;
   at least one front panel that is arranged in front of the chassis to obscure the chassis; and
   at least one device that is mounted on the chassis and supports the or a front panel, wherein the or each device or the or each panel includes at least one retaining element that extends out of the device or panel and is received in a recess in the or each panel or in the or each device respectively to retain the panel on the chassis, the element being manually retractable into the device or panel to allow the panel to be removed from the chassis;
   wherein the chassis is supported in an enclosure by means of a telescopic slider mechanism having a fixed part that is attached to the enclosure, and a movable part that is attached to the chassis, the telescopic slider mechanism being extendable to allow the chassis to be pulled out of the enclosure and retractable to allow the chassis to be pushed back into the enclosure.

10. An assembly as claimed in claim 9, wherein the telescopic slider mechanism comprises a pair of telescopic sliders, one slider being attached to each side of the chassis.

11. An assembly as claimed in claim 9, wherein the or at least one device has an arrangement for enabling it to be secured to the fixed part of the slider mechanism or to the enclosure in order to prevent removal of the chassis from the enclosure.

12. An assembly as claimed in claim 11, wherein the securing arrangement requires the use of a tool to release the device from the slider mechanism or the enclosure.

13. An assembly as claimed in claim 9, wherein the or each device includes a handle to enable the chassis to be pulled out of the enclosure.

14. A chassis for an electronics assembly which includes at least one device that is mounted on the chassis for supporting a panel in front of the chassis to obscure it, wherein the or each device includes at least one retaining element that extends out of the device and can be received in a recess in the or each panel for retaining the panel on the chassis, the element being manually retractable into the device to allow the panel to be supported by, or removed from, the chassis.

15. A device for supporting a panel on the chassis of an electronics assembly, the device comprising an elongate body that is mountable on the chassis and has, at each end thereof, a retaining element that extends out of the device to be received in a corresponding recess of a panel and which is manually retractable into the device in order to release the panel.

* * * * *